United States Patent [19]
Kameda et al.

[11] Patent Number: 4,523,232
[45] Date of Patent: Jun. 11, 1985

[54] VIDEO SIGNAL ANALOG-TO-DIGITAL CONVERTER FOR AN IMAGE DISPLAY APPARATUS

[75] Inventors: Osamu Kameda; Takahiro Fuse, both of Tokyo, Japan

[73] Assignee: Casio Computer Co., Ltd., Tokyo, Japan

[21] Appl. No.: 474,547

[22] Filed: Mar. 11, 1983

[30] Foreign Application Priority Data

Mar. 24, 1982 [JP] Japan .................. 57-46776

[51] Int. Cl.³ .................. H04N 5/14; H04N 5/66
[52] U.S. Cl. .................. 358/236; 358/169
[58] Field of Search .............. 358/236, 240, 160, 169, 358/13, 339; 307/358, 359; 382/50, 51, 52, 53

[56] References Cited
U.S. PATENT DOCUMENTS 4,006,298  2/1977  Fowler et al. ............. 358/240
4,268,863  5/1981  Los ........................ 358/160
4,403,253  9/1983  Morris et al. .............. 358/160
4,427,978  1/1984  Williams .................. 358/236

Primary Examiner—John C. Martin
Assistant Examiner—Howard L. Carter
Attorney, Agent, or Firm—Frishauf, Holtz, Goodman and Woodward

[57] ABSTRACT

A video signal analog-to-digital converter for an image display device comprises a reference signal generator, which can detect variations of the average level of a video signal and generate a variable upper and a variable lower reference potential in accordance with the variations detected. An analog-to-digital converting circuit A/D converts the video signal between present variable upper and lower reference potentials to produce a digital code signal. Brightness control of an LC display panel is done according to the digital code signal.

5 Claims, 25 Drawing Figures

VIDEO SIGNAL ANALOG-TO-DIGITAL CONVERTER FOR AN IMAGE DISPLAY APPARATUS

BACKGROUND OF THE INVENTION

This invention relates to a video signal analog-to-digital converter for an image display apparatus, in which an upper and a lower potential level are variable so as to determine a gradation range in which the brightness of an image is controlled according to the varying average level of a television video signal.

Recently, liquid crystal television receivers, which use a liquid crystal display panel instead of a cathode-ray tube, have been developed and made known to the public as small, portable television sets. It is generally agreed that the brightness of the image displayed on the liquid crystal display panel can be adequately controlled in 16 gradations.

For providing these 16 different gradations, respective gradation signals are applied to a predetermined electrode provided in the liquid crystal display panel. The gradation signals are obtained by sampling the television video signal, for example, 160 times in a predetermined sampling gate time, and obtaining n-bit, for instance, 4-bit, code signals through analog-to-digital conversion of the sample signal. If 16 4-bit code signals of "0000" to "1111" are obtainable, the brightness can be controlled in 16 gradations between the two extremeties.

In the meantime, the television video signal must be brightness-controlled in 16 gradations from the upper reference potential corresponding to a white level to the lower reference potential corresponding to a black level. The level of the actual video signal, however, varies only in the range toward the upper reference potential when the image is very bright or in the range toward the lower reference potential when the image is very dark. Therefore, of the 16 gradations that are available for image control, only about 10 gradations, for example, are truly effective, so that the range of contrast control is narrowed to that extent.

Moreover, to increase the number of gradations to 32, 64, etc. thereby to improve contrast, an increased number of comparators must be provided in the analog-to-digital converter. This complicates the construction and increases the cost.

SUMMARY OF THE INVENTION

An object of this invention is to provide a video signal analog-to-digital converter for an image display apparatus, which A/D converts a video signal between an upper and a lower reference potential which are variable with the average level of the video signal.

To attain the object of the invention, there is provided a video signal analog-to-digital converter for an image display device, which samples a video signal and converts the sampled video signal into n-bit digital codes which are used to control the brightness of the image displayed, which comprises reference potential generating means including means for detecting the average level of a video signal, means for generating an upper and a lower reference potential for setting a reference potential width, and means connected to the video signal average level detecting means for generating a variable upper and a variable lower reference potential for setting a potential width, over which the video signal is coded by varying the upper and lower reference potentials according to variations in the average level of the video signal; means connected to the reference potential generating means for analog-to-digital converting the video signal in the potential range between the upper and lower reference potentials determined by the average level of the video signal; and circuit means connected to the analog-to-digital converting means for generating and supplying a bias signal to the analog-to-digital converting means.

With this construction of the video signal analog-to-digital converter for an image display apparatus according to the invention, the upper and lower reference potentials, between which a video signal is to be analog-to-digital converted, can be varied according to the average level of the video signal.

Thus, there is no need to cover the entire brightness control range from the white level to the black level, but rather, the brightness control can be effected between reference potentials which are variable according to the gray level of the image. Further, there is no need to increase the comparators used in the analog-to-digital converter, so that it is possible to simplify the construction and reduce the cost.

DETAILED DESCRIPTION OF THE PREFERRED EMBODIMENTS

An embodiment of the invention will now be described with reference to the drawings.

Figure 1:
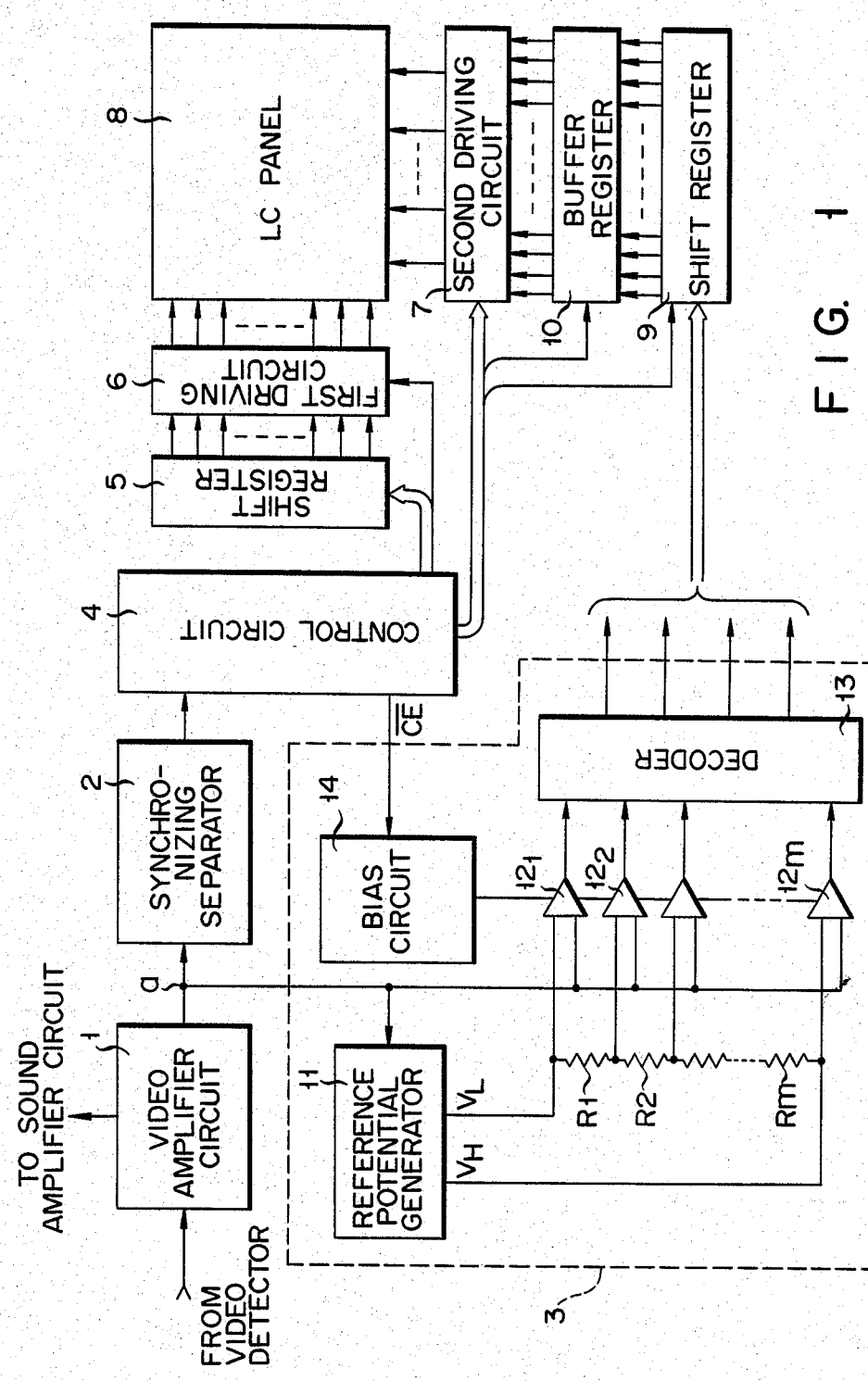
FIG. 1 is a schematic representation of an embodiment of the video signal analog-to-digital converter according to the invention shown in relation to an image display apparatus.

FIG. 1 shows a video signal analog-to-digital converter according to the invention, which is assembled in and connected to an image display apparatus. A video signal from a video signal detecting circuit (not shown) is amplified in a video amplifier circuit 1 to be fed to a synchronizing signal separator 2 and also to the video signal analog-to-digital converter 3. The video amplifier circuit 1 also provides an output signal which is fed to a sound amplifier circuit (not shown). The synchronizing signal separator 2 separates the horizontal and vertical synchronizing signals from the video signal input, the separated synchronizing signals being fed to a control citcuit 4. The control circuit 4 supplies a drive signal through a shift register 5 to a first driving circuit 6 as will be described later in detail. The first driving circuit 6 supplies a signal for achieving vertical scanning (i.e., scanning of a common electrode) to a liquid crystal display panel 8 (hereinafter refered to as an LC panel). The control circuit 4 also supplies a chip-enable signal $\overline{CE}$ for selecting any portion of the video signal which corresponds to every other horizontal scanning line to the video signal analog-to-digital converter 3. This is because, if the whole video signal is to be displayed on the LC panel 8, many elements associated with all effective horizontal scanning lines (about 480 lines) must be provided and driven. To provide so many elements and drive them is practically impossible with an image display apparatus having a LC panel. The chip-enable signal $\overline{CE}$ is generated only while the video signal is sampled in order to save power. The video signal analog-to-digital converter 3 converts the video signal from the video amplifier circuit 1 into a 4-bit parallel digital signal which is supplied to a shift register 9. The data fed to the shift register 9 is progressively transferred through a buffer register 10 to a second driving circuit 7 under the control of a timing signal provided from the control circuit 4. The second driving circuit 7 includes a decoder and gates. It receives a pulse signal from the control circuit 4 and produces, for instance, 16 gradation signals. The gradation signals are supplied to the LC panel 8, thus driving the electrodes. The shift register 9, a buffer register 10 and a second driving circuit 7 as disclosed in "Nikkei Electronics" (Feb. 16, 1981, Nikkei McGraw-Hill Inc.) in which the LC panel has a double matrix electrode structure may be used.

The video signal analog-to-digital converter 3 will now be described in detail. A reference potential generator 11 generates a variable upper and a variable lower reference potential $V_H$ and $V_L$ according to the video signal a supplied to it from the video amplifier circuit 1. The potential difference between the variable upper and lower reference potentials $V_H$ and $V_L$ is fed to a voltage divider consisting of series resistors $R_1, R_2, \ldots, R_m$. The voltage division outputs of the voltage divider are fed as respective reference potentials to comparators $12_1, 12_2, \ldots, 12_n$. The comparators $12_1, 12_2, \ldots, 12_n$ receive the video signal a as a signal to be compared. They compare the video signal a with the respective reference potentials only while a bias voltage is supplied from the bias circuit 14. Their output signals are fed to a decoder 13. The bias circuit 14 receives the chip-enable signal $\overline{CE}$ supplied from the control circuit 4 noted above and operates in synchronism with this signal. The decoder 13 thus converts the video signal a into a digital signal, e.g., a 4-bit code signal, which is fed to the shift register 9.

Figure 2:
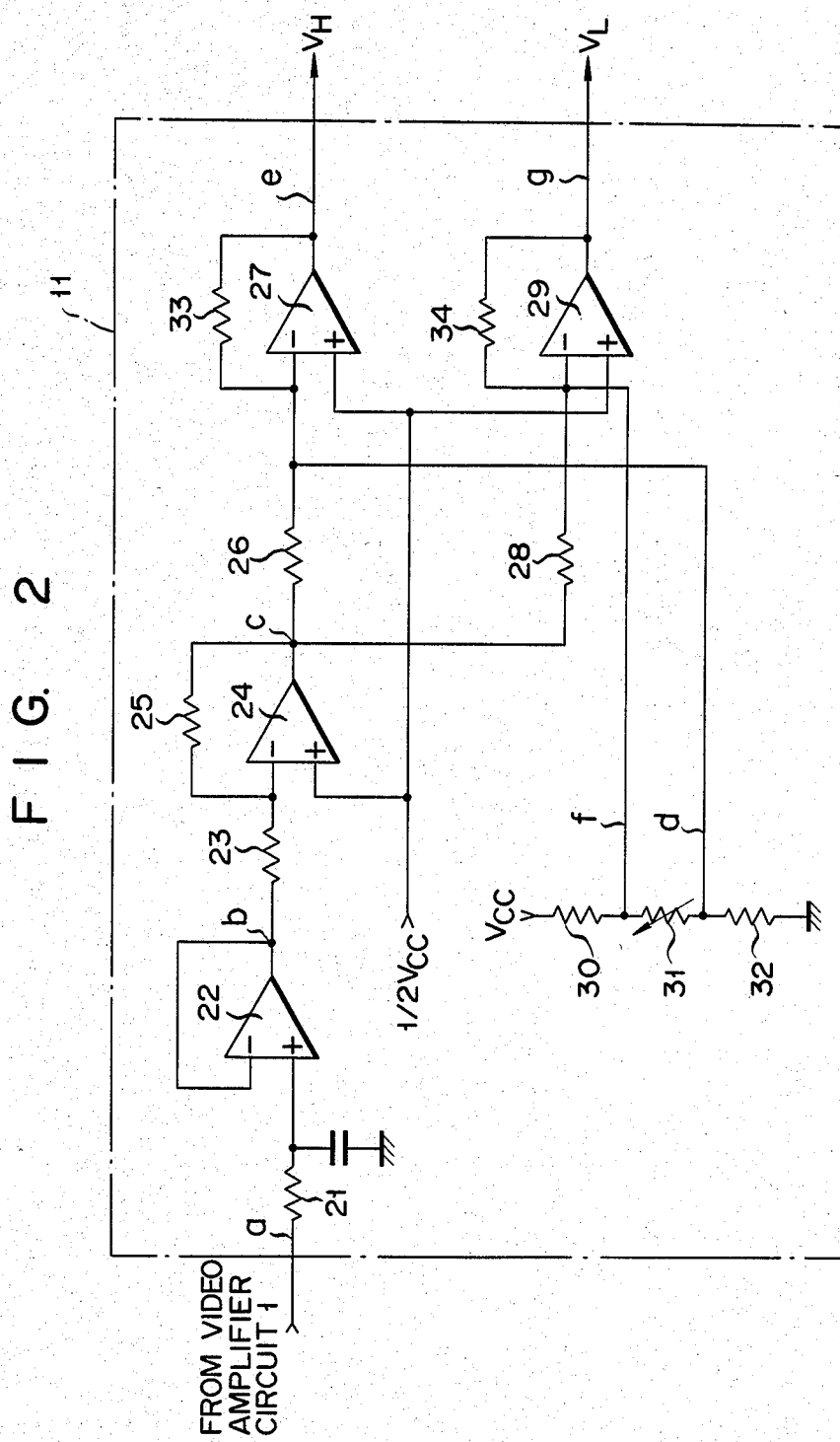
FIG. 2 is a circuit diagram showing a specific construction of a reference potential generator 11 shown in FIG. 1.

FIG. 2 shows the reference potential generator 11 in detail. The video signal a supplied from the video amplifier circuit 1 is fed through an integrating circuit 21 to a positive input terminal of an operational amplifier 22. The operational amplifier 22 serves as a voltage follower buffer. Its output is fed back to its negative input terminal and is also fed to a negative input terminal of an operational amplifier 24. A DC voltage equal to one half the supply voltage $V_{cc}$ is applied to a positive input terminal of the operational amplifier 24. The output of the operational amplifier 24 is fed back through a resistor 25 to its negative input terminal. The operational amplifier 24 serves as a DC inversion amplifier, and its output is also fed through a register 26 to a negative input terminal of an operational amplifier 27, and is further fed through a register 28 to a negative input terminal of an operational amplifier 29. One half the supply voltage noted above is also applied to a positive input terminal of each of the operational amplifiers 27 and 29. The supply voltage $V_{cc}$ is divided by a voltage divider, which includes a resistor 30, a variable resistor 31 and a resistor 32, these resistors being connected in series. A division voltage f that is obtained at the connection point between the resistor 30 and variable resistor 31 is supplied to the negative input terminal of the operational amplifier 29, while a division voltage d obtained at the connection point between the variable resistor 31 and resistor 32 is supplied to the negative input terminal of the operational amplifier 27. The outputs of the operational amplifiers 27 and 29 are fed back through respective resistors 33 and 34 to their own negative input terminals. The division voltages f and d are respective upper and lower reference potentials for setting a reference potential width. The outputs of the operational amplifiers 27 and 29 are, respectively, the variable upper and lower reference potentials $V_H$ and $V_L$ corresponding to the potentials f and d which vary according to changes in the average level of the video signal.

Figure 3:
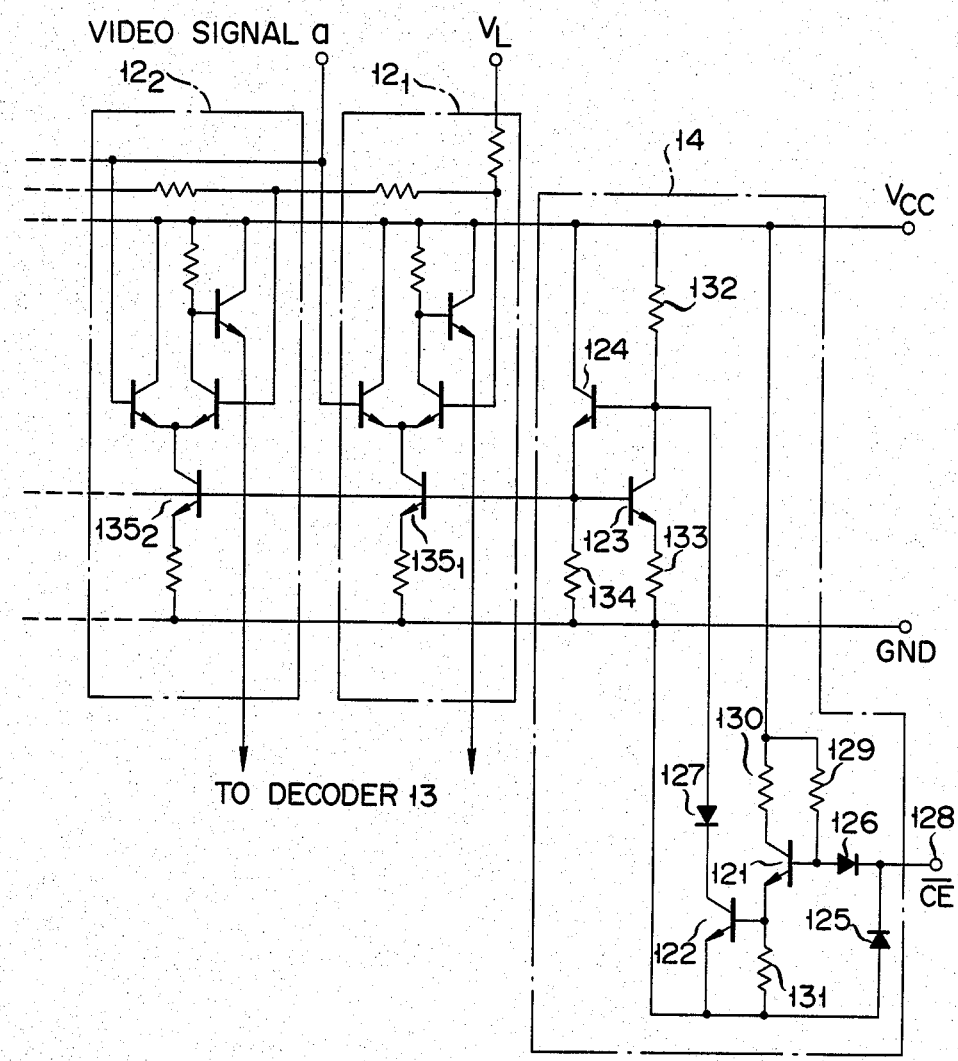
FIG. 3 is a circuit diagram showing a specific construction of a bias circuit and comparators $12_1, 12_2, \ldots$ shown in FIG. 1.
Figure 4:
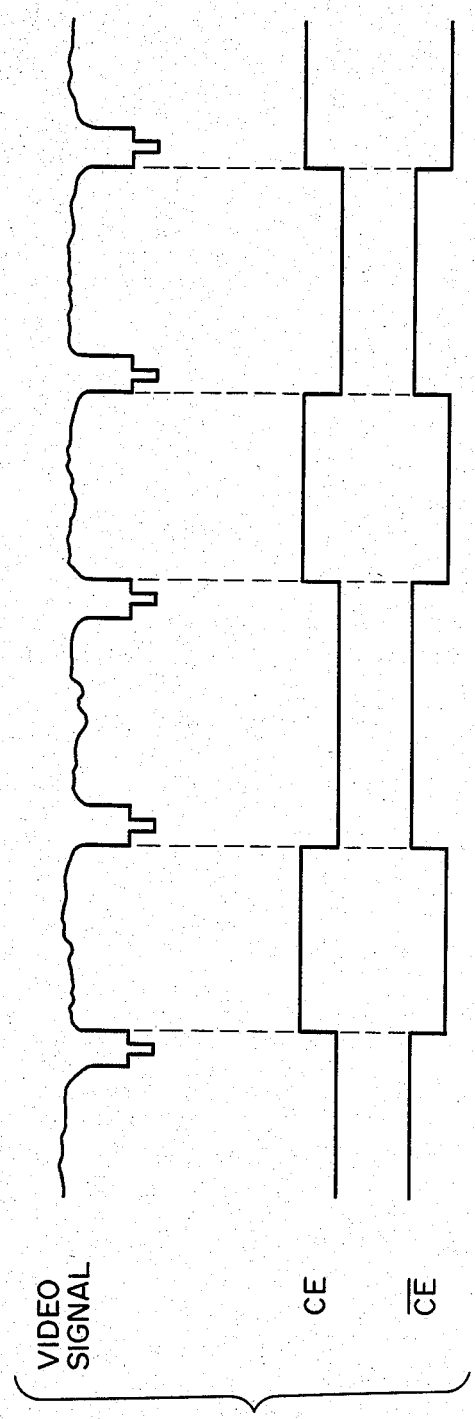
FIG. 4 is a waveform chart for explaining a chip-enable signal produced from a control circuit shown in FIG. 1.

FIG. 3 shows in detail the comparators $12_1, 12_2, \ldots 12_n$ receiving the respective outputs of the reference potential generator 11 and bias circuit 14 supplying the bias signal to these comparators. The bias circuit 14 includes transistors 121 to 124, e.g., N-channel transistors, diodes 125 and 126 and a Schottky diode 127. A terminal 128, to which the chip-enable signal $\overline{CE}$ is supplied, is grounded through the diode 125 connected in the illustrated polarity, and is also connected through the diode 126 to the base of the transistor 121. The base and collector of the transistor 121 are connected through respective resistors 129 and 130 to the supply voltage terminal $V_{cc}$, and its emitter is grounded through a resistor 131 and also connected to the base of the transistor 122. The transistor 122 has its emitter grounded and its collector connected through the diode 127 to the collector of the transistor 123 and the base of the transistor 124. The transistor 123 has its collector connected through a resistor 132 to the supply voltage terminal $V_{cc}$ and its emitter grounded through a resistor 133. The transistor 124 has its collector connected to the supply voltage terminal $V_{cc}$ and its emitter grounded through a resistor 134 and also connected to the base of the transistor 123. The potential on the emitter of the transistor 124 is supplied as base bias to switching transistors $135_1, 135_2, \ldots$ which are inserted in the current path of the respective comparators $12_1, 12_2, \ldots$ The operation of the embodiment will now be described. The chip-enable signal $\overline{CE}$ is obtained by inverting a signal CE as shown in FIG. 4. This signal is for selecting a video signal for every other horizontal scanning line. It is at a high level for every other horizontal scanning line and at a low level for the rest. It is supplied from the control circuit 4 to the terminal 128 of the bias circuit 14 shown in FIG. 3 as described before. When it becomes a low level, the diode 126 is turned on, causing the base potential on the transistor 121 to become low level. As a result, the base current in the transistor 121 is cut off to turn off this transistor 121, and hence, turn off the transistor 122, thus turning off the diode 127. With the diode 127 turned off, the connection point between the collector of the transistor 123 and the base of the transistor 124 is brought to a high potential. The transistors 123 and 124 are thus turned on to supply a proper base current to the switching transistors $135_1$, $135_2$, ... of the comparators $12_1$, $12_2$, .... The switching transistors $135_1$, $135_2$, ... are thus turned on to render the comparators $12_1$, $12_2$, ... operative for sampling the video signal.

When the chip-enable signal $\overline{CE}$ becomes high level, the diode 126 is reversely biased to be turned off and thus increase the base potential on the transistor 121. As a result, the transistor 121 is turned off to turn off the transistor 122 so as to turn on the diode 127, thus lowering the base potential on the transistor 124 to approximately 0.4 volt. The transistors 124 and 123 are thus turned off to cut off the base current supplied to the switching transistors $135_1$, $135_2$, .... The transistors $135_1$, $135_2$, ... are thus turned off to render the comparators $12_1$, $12_2$, ... inoperative.

The chip-enable signal $\overline{CE}$ that is supplied to the bias circuit 14 may be replaced with the non-inverted signal CE.

Figure 5:
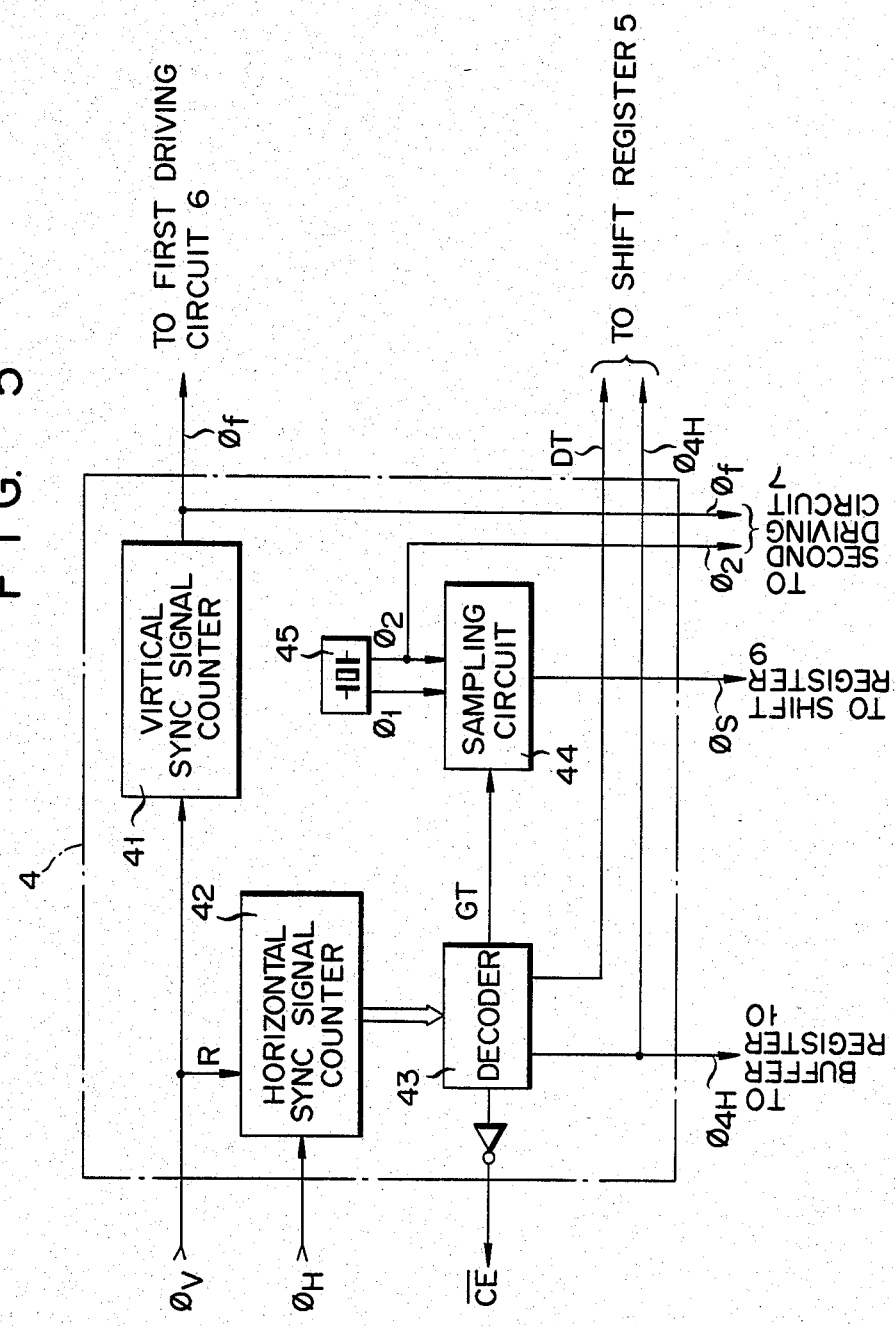
FIG. 5 is a circuit diagram showing a specific construction of the control circuit 4.
Figure 6:
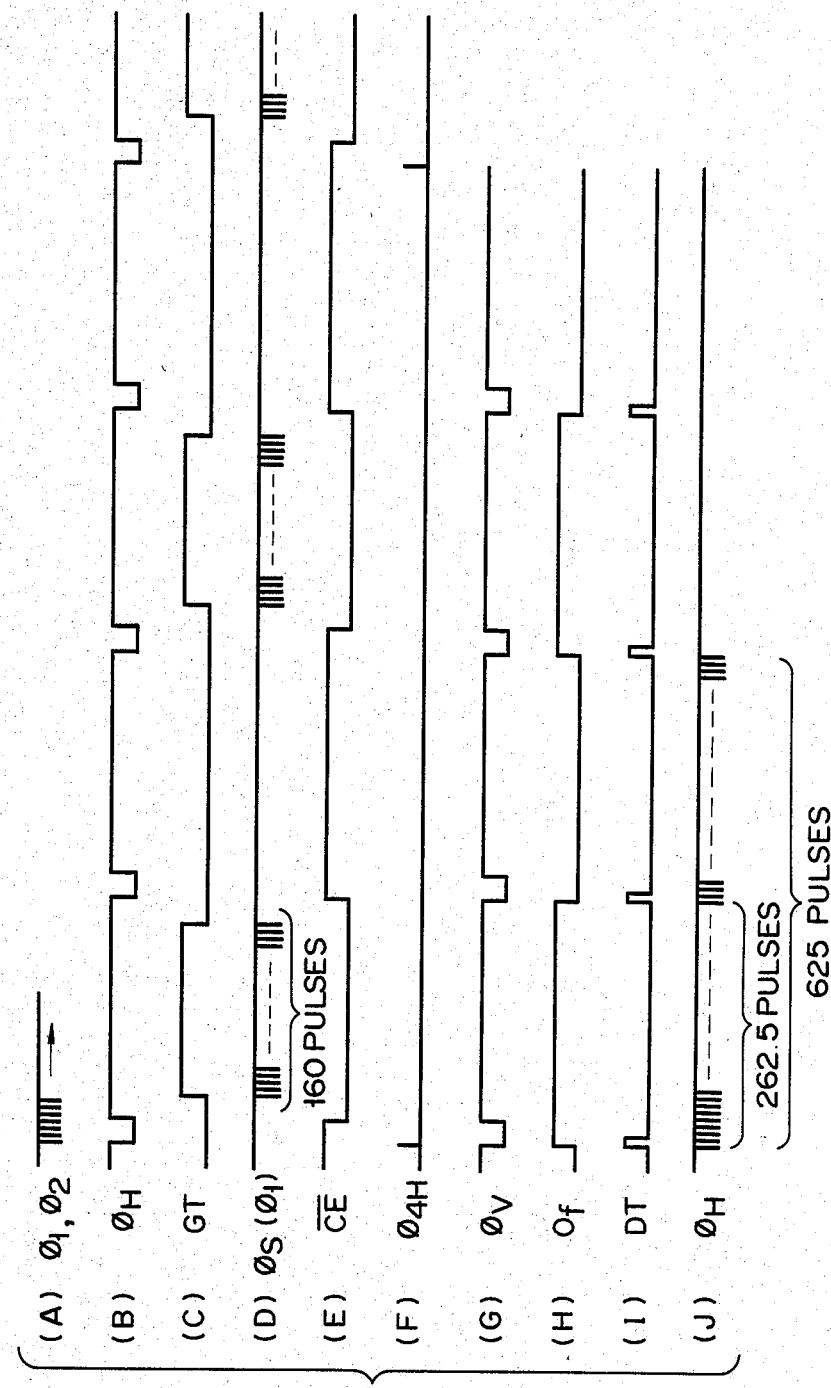
FIGS. 6(A) to 6(J) are a timing chart for explaining the operation of the control circuit 4.

FIG. 5 shows in detail the control circuit 4, which produces the chip-enable signal, and FIGS. 6(A) to 6(J) show a timing chart of the operation of this circuit. The circuit includes a vertical sync signal generator 41, which receives the vertical sync signal $\phi_V$ (shown in (G) in FIG. 6) and supplies a frame switching signal $\phi_f$ (shown in (H) in FIG. 6) to the first driving circuit and also to the second driving circuit 7. The frame switching signal $\phi_f$ is for inverting a voltage applied to the LC panel 8 for every frame. A horizontal sync signal generator 42 receives the horizontal sync signal $\phi_H$ (shown in (B) and (J) in FIG. 6) and produces the chip-enable signal $\overline{CE}$ (shown in (E) in FIG. 6) which is supplied to the bias circuit 14 of the video signal analog-to-digital converter 3 for selecting the video signal for every other horizontal scanning line. A sampling circuit 44 receives clock pulses $\phi_1$ and $\phi_2$ (shown in (A) in FIG. 6) of different phases provided from a 36-MHz oscillator 45, and samples the clock pulses $\phi_1$ during video signal sampling gate time periods (shown in (C) in FIG. 6) which are determined by the output of the decoder 43. The sampled clock pulses, i.e., 160 pulses in each gate time period, are supplied as a shift clock signal $\phi_S$ (shown in (D) in FIG. 6) to the shift register 9. The decoder 43 supplies a latch clock signal $\phi_{4H}$ (shown in (F) in FIG. 6) to the buffer register 10 for reading the digital code signal transferred to the shift register 9. The second driving circuit 7 receives the clock pulse signal $\phi_2$ which is supplied as a reference signal for a gradation signal formation from the oscillator 45, and also the frame switch clock signal $\phi_f$ from the vertical sync signal counter 41, and produces a 16-gradation signal from the digital code signal transferred from the buffer register 10. The 16-gradation signal is supplied to the LC panel 8 for controlling the scanning of Y-electrodes. The shift register 5 receives a code signal DT (shown in (I) in FIG. 6) and the shift clock signal $\phi_{4H}$ as well as the frame switching clock signal $\phi_f$ from the vertical sync signal counter 41. The code signal DT is a "1" signal which is shifted through the shift register 5. X-electrodes in the LC panel 8 are scanned with the shifting of the "1" signal.

The operation of the video signal analog-to-digital converter 3 will now be described with reference to FIGS. 7(A) to 7(B). The video signal a supplied from the video amplifier circuit 1 to the analog-to-digital converter 3 is shown in (A) in FIG. 7. This video signal a is integrated in the integrating circuit 21, shown in FIG. 2. The output of the integrating circuit 21 is amplified in the operational amplifier 22 to obtain a signal b as shown in (B) in FIG. 7. The signal b changes to follow changes in the average level of the video signal a. It is inverted and amplified in the operational amplifier 24 to produce a signal having a waveform as shown in (C) in FIG. 7. Since the operational amplifier 24 is given the reference voltage of $\frac{1}{2} V_{cc}$, its output signal c is given as:

$$c = (\tfrac{1}{2} \times V_{cc} - b) + \tfrac{1}{2} \times V_{cc} = V_{cc} - b.$$

Figure 7:
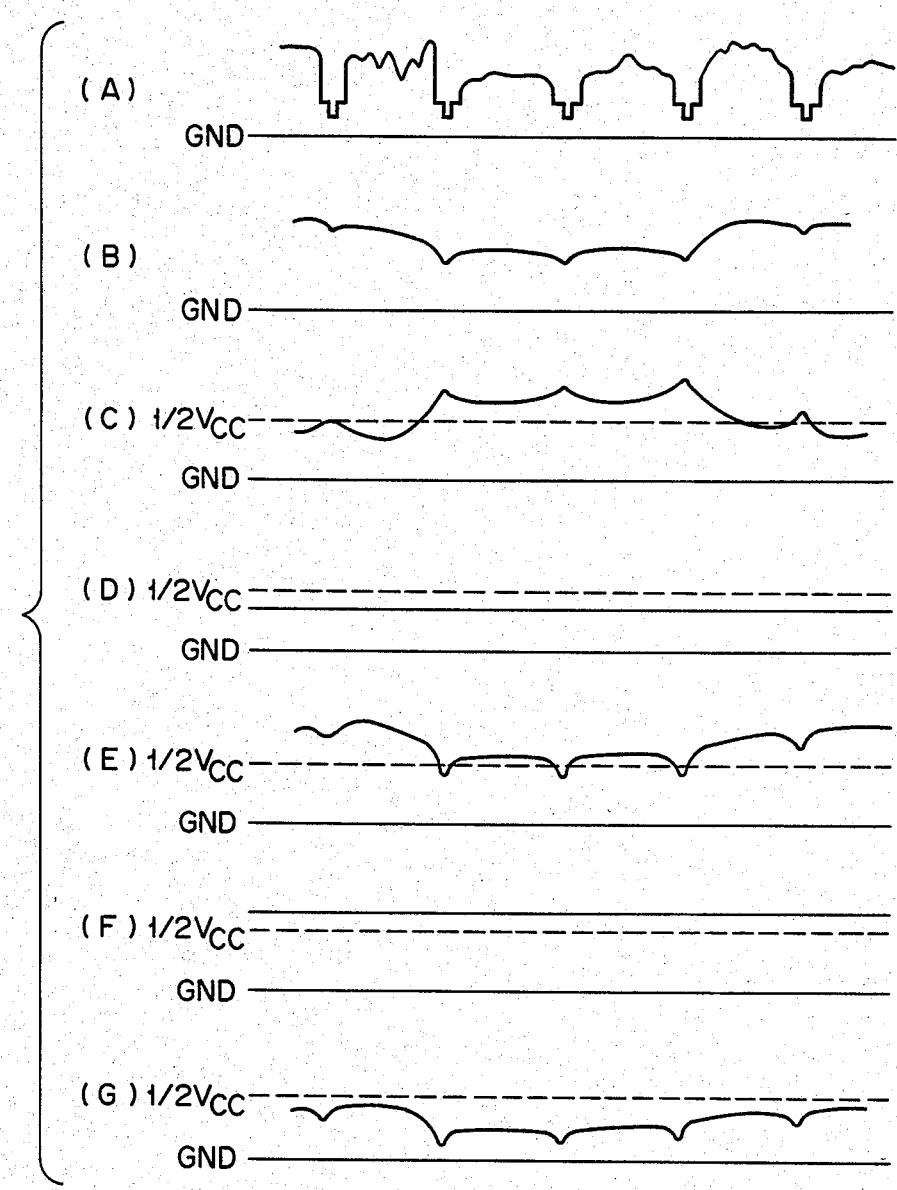
FIGS. 7(A) to 7(G) are a waveform chart for explaining the operation of the reference potential generator.

This output signal c is inverted and amplified in the operational amplifier 27 to obtain a reference potential signal $V_H$ as shown in (E) in FIG. 7. The operational amplifier 27 receives a voltage equal to one half the supply voltage $V_{cc}$ supplied to its positive input terminal, and the division voltage d supplied from the connection point between the variable resistor 31 and resistor 32 to its negative input terminal. Thus, its output e is:

$$\begin{aligned}
e &= V_H \\
&= (1/2 \times V_{cc} - \underline{c}) + (1/2 \times V_{cc} - \underline{d}) + 1/2 \times V_{cc} \\
&= 3/2 \times V_{cc} - \underline{c} - \underline{d} \\
&= 3/2 \times V_{cc} - (V_{cc} - \underline{b}) - \underline{d} \\
&= 1/2 \times V_{cc} + \underline{b} - \underline{d}.
\end{aligned}$$

The division voltage d is set to a level lower than one half the supply voltage $V_{cc}$, e.g., a level as shown in (D) in FIG. 7. The output of the operational amplifier 24 is also inverted and amplified in the operational amplifier 29 to obtain a signal g as shown in (G) in FIG. 7. This signal g is a reference potential $V_L$. The operational amplifier 29 is receives one half the supply voltage $V_{cc}$ at its positive input terminal and the division voltage supplied from the connection point between the resistor 30 and variable resistor 31 to its negative input terminal. The signal g is thus:

$$\begin{aligned}
g &= V_L \\
&= (1/2 \times V_{cc} - \underline{c}) + (1/2 \times V_{cc} - \underline{f}) + 1/2 \times V_{cc} \\
&= 3/2 \times V_{cc} - \underline{c} - \underline{f} \\
&= 3/2 \times V_{cc} - (V_{cc} - \underline{b}) - \underline{f} \\
&= 1/2 \times V_{cc} + \underline{b} - \underline{f}.
\end{aligned}$$

This division voltage f is set to a level higher than one half the supply voltage $V_{cc}$, e.g., as shown in (F) in FIG. 7.

Figure 8:
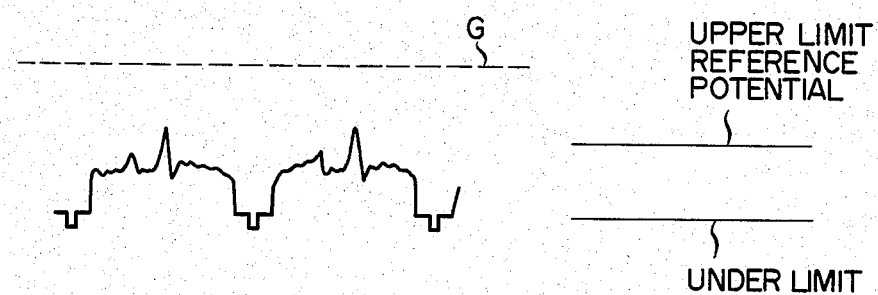
FIGS. 8 to 10 are views showing the relation between the waveform of a video signal and variable upper and lower limit reference potentials for explaining the effects of the invention.
Figure 9:
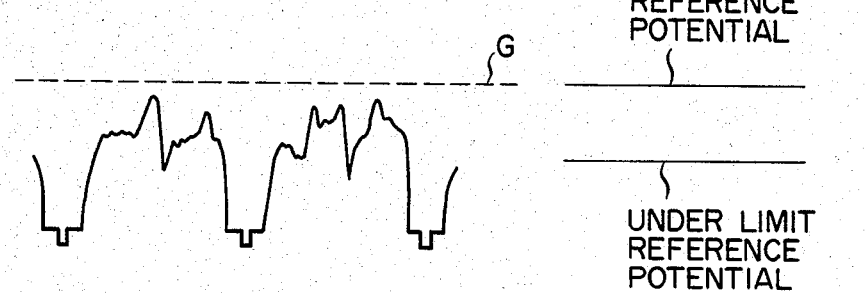
Figure 10:
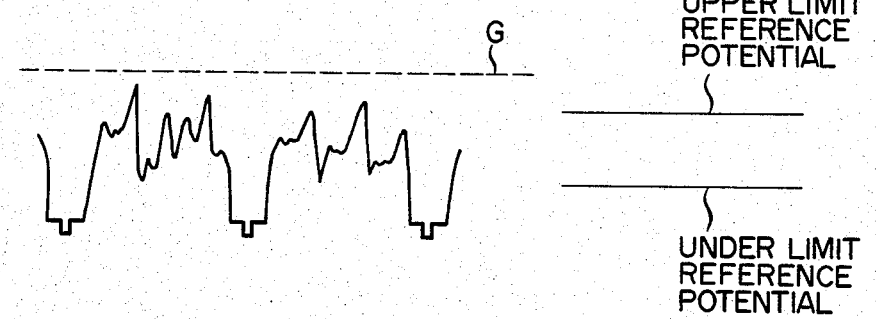

The division voltages d and f expressed by the above equations change with the resistance offered by the variable resistor 31, and the reference potentials $V_H$ and $V_L$ change with the division voltages d and f. The reference potentials $V_H$ and $V_L$ also change according to the output b of the operational amplifier 22, i.e., in accordance with the average value of the video signal. It should be noted that the location of the potential difference or gap between the reference potentials $V_H$ and $V_L$, over which the analog-to-digital conversion is performed, can be changed with respect to the average level of the video signal by varying the resistance of the variable resistor 31. To be more specific, when the image is dark, at which time the average level of the video signal is low, the reference potentials $V_H$ and $V_L$ are comparatively low, as shown in FIG. 8. When the image is bright, at which time the average level of the video signal is high, the reference potentials are comparatively high, as shown in FIG. 9. FIG. 10 shows the relation between an intermediate level video signal and reference potentials. The analog-to-digital conversion output of the decoder 13 is varied so as to change the contact with the location of the gap between the reference potentials $V_H$ and $V_L$, which itself varies with respect to the average value of the video signal. The contrast can thus be adjusted by adjusting the variable resistor 31.

What we claim is:

1. A video signal analog-to-digital converter for an image display device, which samples a video signal and converts the sampled video signal into n-bit digital codes used to control the brightness of the image displayed, comprising:

reference potential generating means including means for detecting the average level of a video signal, means for generating an upper and lower reference potential for setting a reference potential width, and means connected to said video signal average level detecting means for generating a variable upper and a variable lower reference potential for setting a potential width, over which said video signal is coded, by varying said upper and lower reference potentials according to variations in the average level of said video signal;

means connected to said reference potential generating means for analog-to-digital converting said video signal in the potential range between the upper and lower reference potentials determined by the average level of said video signal; and bias circuit means connected to said analog-to-digital converting means for generating and supplying a bias signal to provide it to the said analog-to-digital converting means.

2. A video signal analog-to-digital converter for an image display device according to claim 1, wherein said means for generating said upper and lower reference potentials for setting said reference potential width are manually set.

3. A video signal analog-to-digital converter for an image display device according to claim 1, wherein said image display device is a television receiver.

4. A video signal analog-to-digital converter for an image display device according to claim 3, wherein said television receiver is a liquid crystal television receiver.

5. A video signal analog-to-digital converter according to claim 1, wherein said bias circuit means receives an enabling signal for selecting any portion of the video signal that corresponds to every other horizontal scanning line and renders said analog-to-digital converting means operative only during the period of sampling the video signal.

* * * * *

UNITED STATES PATENT AND TRADEMARK OFFICE
CERTIFICATE OF CORRECTION

PATENT NO. : 4,523,232

DATED : June 11, 1985

INVENTOR(S) : Osamu KAMEDA, et al

It is certified that error appears in the above-identified patent and that said Letters Patent is hereby corrected as shown below:

COLUMN 5, line 27, after "drawing circuit" insert the reference numeral --6--;

COLUMN 7 (claim 1), line 15, after "and converts the" delete the word "sampled".

Signed and Sealed this

Twenty-ninth Day of October 1985

[SEAL]

Attest:

DONALD J. QUIGG

Attesting Officer

Commissioner of Patents and Trademarks—Designate